US011072842B2

(12) United States Patent
Nakano et al.

(10) Patent No.: US 11,072,842 B2
(45) Date of Patent: Jul. 27, 2021

(54) RARE EARTH THIN FILM MAGNET AND METHOD FOR PRODUCING SAME

(71) Applicant: JX Nippon Mining & Metals Corporation, Tokyo (JP)

(72) Inventors: Masaki Nakano, Nagasaki (JP); Hirotoshi Fukunaga, Nagasaki (JP); Takeshi Yanai, Nagasaki (JP); Hironobu Sawatari, Ibaraki (JP)

(73) Assignee: JX NIPPON MINING & METALS CORPORATION, Tokyo (JP)

( * ) Notice: Subject to any disclaimer, the term of this patent is extended or adjusted under 35 U.S.C. 154(b) by 386 days.

(21) Appl. No.: 16/080,036

(22) PCT Filed: Mar. 29, 2017

(86) PCT No.: PCT/JP2017/012787
§ 371 (c)(1),
(2) Date: Aug. 27, 2018

(87) PCT Pub. No.: WO2017/179422
PCT Pub. Date: Oct. 19, 2017

(65) Prior Publication Data
US 2019/0062880 A1 Feb. 28, 2019

(30) Foreign Application Priority Data

Apr. 15, 2016 (JP) .............................. JP2016-081697

(51) Int. Cl.
*C23C 14/06* (2006.01)
*C22C 38/00* (2006.01)
(Continued)

(52) U.S. Cl.
CPC ............ *C22C 38/005* (2013.01); *C22C 38/00* (2013.01); *C23C 14/06* (2013.01); *C23C 14/28* (2013.01);
(Continued)

(58) Field of Classification Search
CPC ....... C22C 38/00; C22C 38/005; C23C 14/06; C23C 14/28; H01F 10/126; H01F 1/057; H01F 41/20; H01F 41/205
(Continued)

(56) References Cited

U.S. PATENT DOCUMENTS 7,790,300 B2 9/2010 Suzuki et al.
9,972,428 B2 5/2018 Shindo
(Continued)

FOREIGN PATENT DOCUMENTS

JP 2003-303708 A 10/2003
JP 2007-088101 A 4/2007
(Continued)

OTHER PUBLICATIONS

NPL-2: Nakano et al, Nd—Fe—B film magnets with thickness above 100mm deposited on Si substrates, IEEE Transactions on Magnetics, vol. 51, No. 11, Nov. 2015. (Year: 2015).*
(Continued)

*Primary Examiner* — Jie Yang
(74) *Attorney, Agent, or Firm* — Howson & Howson LLP

(57) ABSTRACT

Provided is a rare earth thin film magnet having Nd, Fe and B as essential components, which is characterized in that a Nd—Fe—B base film is formed on a Si substrate having an oxide film formed on a surface thereof and has a composition in which the Nd content is higher than that of a stoichiometric composition and that a film (nano composite film) is formed on the base film and has a texture in which an α-Fe phase and $Nd_2Fe_{14}B$ are alternately arranged and three-dimensionally dispersed. The rare earth thin film magnet provided is less susceptible to the occurrence of film separation and substrate breakage and exhibits favorable magnetic properties.

17 Claims, 4 Drawing Sheets

(51) Int. Cl.
C23C 14/28 (2006.01)
C23C 14/58 (2006.01)
H01F 1/057 (2006.01)
H01F 10/14 (2006.01)
H01F 41/02 (2006.01)
H01F 41/20 (2006.01)
H01F 10/12 (2006.01)

(52) U.S. Cl.
CPC .......... *C23C 14/58* (2013.01); *C23C 14/5806* (2013.01); *H01F 1/057* (2013.01); *H01F 10/126* (2013.01); *H01F 10/14* (2013.01); *H01F 41/02* (2013.01); *H01F 41/20* (2013.01); *H01F 41/205* (2013.01)

(58) Field of Classification Search
USPC .......................................................... 148/331
See application file for complete search history.

(56) References Cited

U.S. PATENT DOCUMENTS

| | | | |
|---|---|---|---|
| 2002/0192502 A1* | 12/2002 | Uehara | H01F 10/126 428/811 |
| 2015/0008998 A1 | 1/2015 | Kishimoto et al. | |
| 2015/0017053 A1 | 1/2015 | Shindo | |
| 2015/0047469 A1 | 2/2015 | Hino et al. | |
| 2015/0262752 A1 | 9/2015 | Sawatari | |
| 2016/0343482 A1 | 11/2016 | Nakano et al. | |
| 2017/0356081 A1 | 12/2017 | Nakano et al. | |
| 2020/0111590 A1 | 4/2020 | Nakano et al. | |

FOREIGN PATENT DOCUMENTS

| | | |
|---|---|---|
| JP | 2009-091613 A | 4/2009 |
| JP | 2012-207274 A | 10/2012 |
| JP | 2012-235003 A | 11/2012 |
| WO | 2014/038022 A1 | 3/2014 |
| WO | 2017/154653 A1 | 9/2017 |

OTHER PUBLICATIONS

H. Fukunaga et al., "Effect of Laser Beam Parameters on Magnetic Properties of Nd—Fe—B Thick-Film Magnets Fabricated by Pulsed Laser Deposition", Journal of Applied Physics, vol. 109, Issue 7, pp. 07A758-1-07A7583, Apr. 2011.
N.M. Dempsey et al., "High Performance Hard Magnetic NdFeB Thick Films for Integration into Micro-Electro-Mechanical-Systems", Applied Physics Letters, vol. 90, pp. 092509-1-092509-3, 2007 (month unknown).
H. Fukunaga et al., "Magnetic Properties of Nd—Fe—B/a-Fe Multi-Layered Thick-Film Magnets", Journal of Physics: Conference Series, vol. 266, pp. 012027-1-012027-5, 2011 (month unknown).
G. Reiger et al., "Nd—Fe—B Permanent Magnets (Thick Films) Produced by a Vacuum-Plasma-Spraying Process", Journal of Applied Physics, vol. 87, pp. 5329-5331, 2000 (month unknown) (Abstract Only).
M. Nakano et al., "Review of Fabrication and Characterization of Nd—Fe—B Thick Films for Magnetic Micromachines", IEEE Transactions on Magnets, vol. 43, Issue 6, pp. 2672-2676, Jun. 2007 (Abstract Only).
M. Ishizone et al., "Magnetic Properties and Crystallite Orientation in Nd2Fe14B-a-Fe Nanocomposite Thin Films", The Magnetics Society of Japan Journal, vol. 24, No. 4-2, pp. 423-426, Jan. 2000.
S Sato, "Nano Kessho Kozo o Motsu Nanshitsu Oyobi Koshitsu Jisei Zairyo ni Okeru Hojiryoku Kiko no Kaiseki", University of Tsukuba Daigakuin Hakushi Katei Suri Busshitsu Kagaku Kenkyuka Hakushi Ronbun, University of Tsukuba Daigakuin, pp. 91 to 98, Feb. 2012 (English Summary provided).
Nakano et al., "Film Formation Isotropic Nd—Fe—B Thick Film Magnet of Si Substrate", The Institute of Electrical Engineers of Japan, Article No. MAG13075, Aug. 2013 (English Abstract Only).
M. Nakano et al., "Nd—Fe—B Film Magnets With Thickness Above 100 μm Deposited on Si Substrates", IEEE Transactions on Magnetics, vol. 51, Issue 11, Nov. 2015 (English Abstract Only).
M. Nakano et al., "Preparation and Magnetic Properties of Thick Film Magnets", Journal of the Japan Institute of Metals, vol. 76, No. 1, pp. 59-64, Jan. 2012.
Yu Chikuma et al., "Thick Film Thickness of Nd—Fe—B Based Magnet Film Deposited on Si Substrate", Kyushu Section, IEICE Rengo Taikai Koen Ronbunshu, vol. 2014, Kyushu Section, IEICE Rengokai, p. 434, Feb. 2016.
Mhan-Joong Kim et al., "Magnetic Properties of NdFeB Thin Film Obtained by Diffusion Annealing", IEEE Transactions on Magnetics, vol. 36, No. 5, pp. 3370-3372, Sep. 2000.
S.N. Piramanayagam et al., "Studies of Cosputtered NdFeB Thin Films", Journal of the Magnetics Society of Japan, vol. 21, No. 4-2, pp. 417-420, Jan. 1997 (English Abstract Only).
S.N. Piramanayagam et al., "Synthesis of Nd—Fe—B thin films with high coercive force by cosputtering", IEEE Transactions on Magnetics, vol. 33, Issue No. 5, pp. 3643-3645, Sep. 1997 (English Abstract Only).
N. Adachi et al., "Synthesys of the Rare Earth Magnetic Film for Microactuators", Ceramics Research Laboratory, Nagoya Institute of Technology, vol. 6, pp. 46-50, 2006 (month unknown) (English Abstract provided).

* cited by examiner

[Fig. 1]
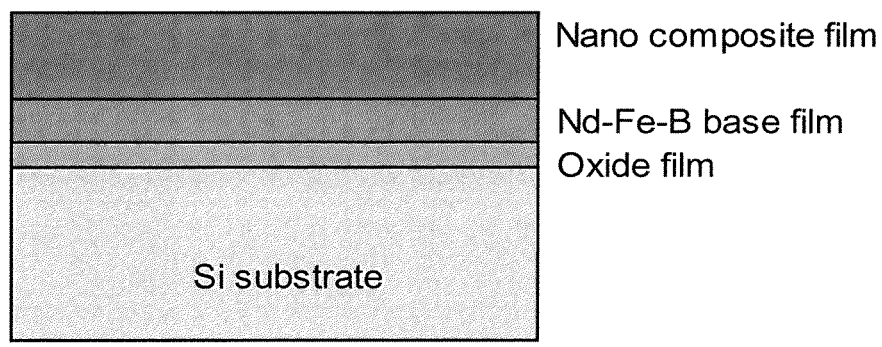
[Fig. 2]
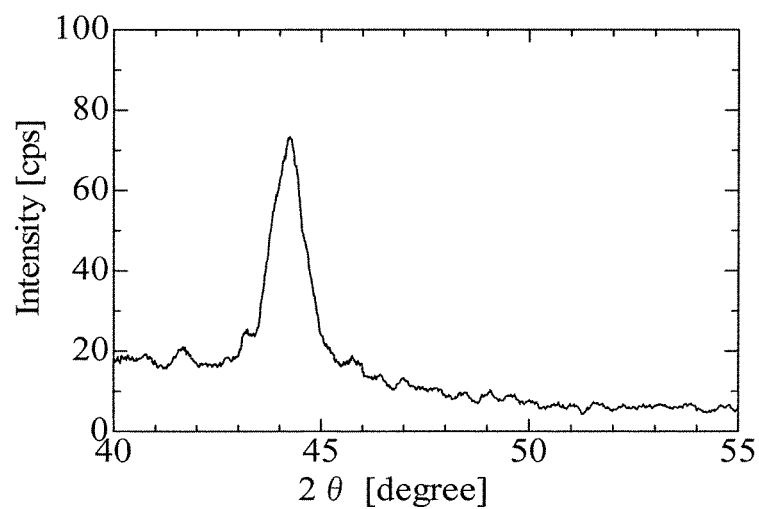

[Fig. 3]
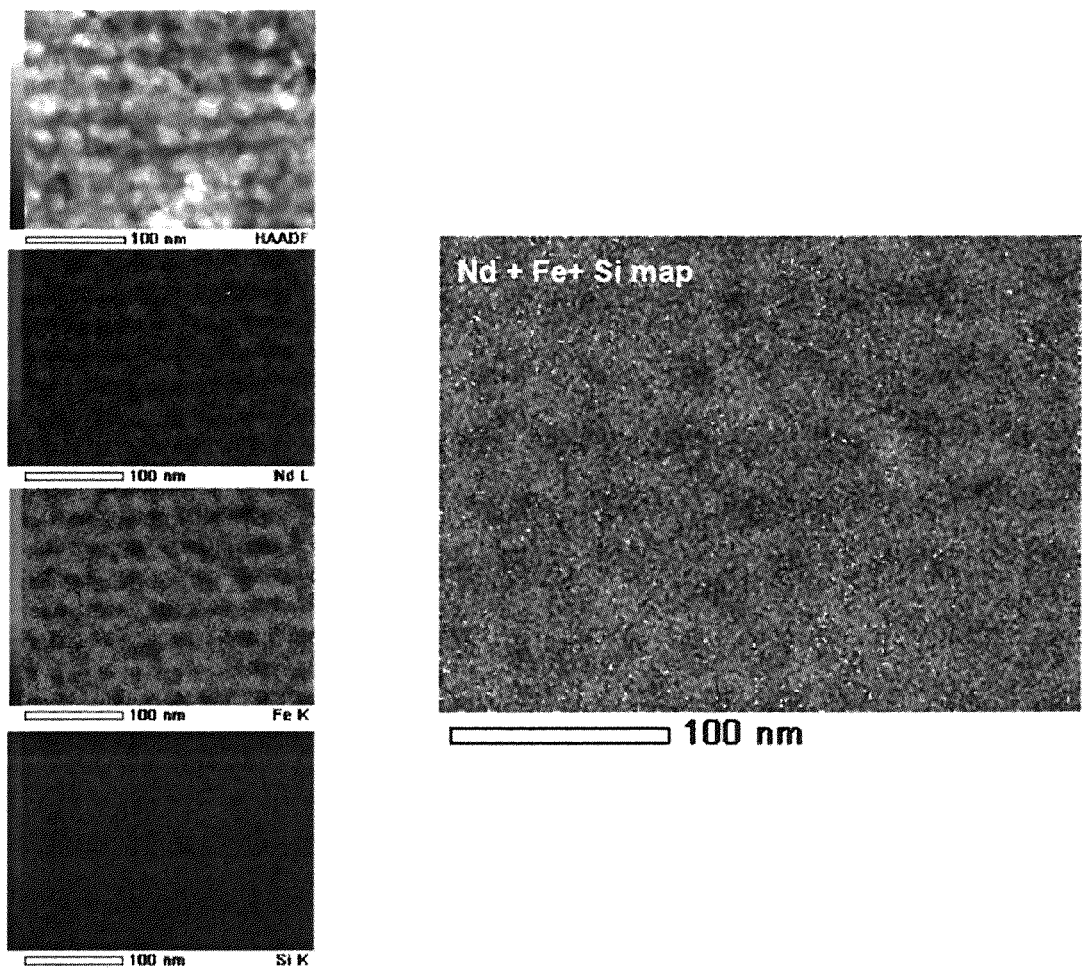

[Fig. 4]
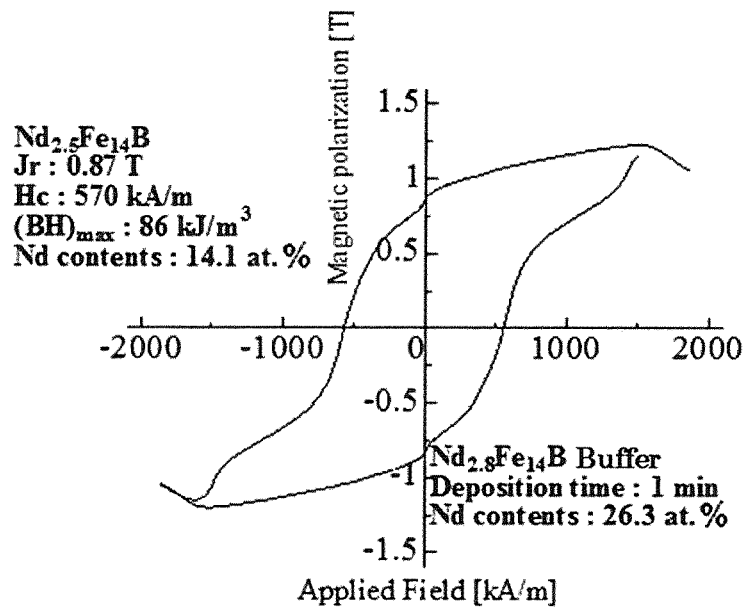
[Fig. 5]
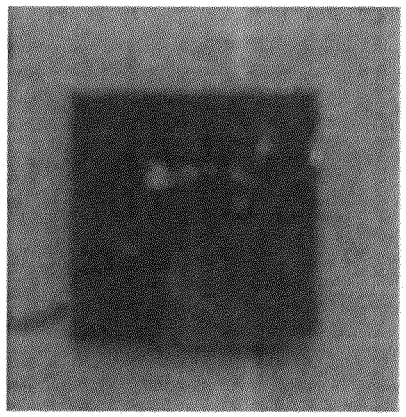

[Fig. 6]
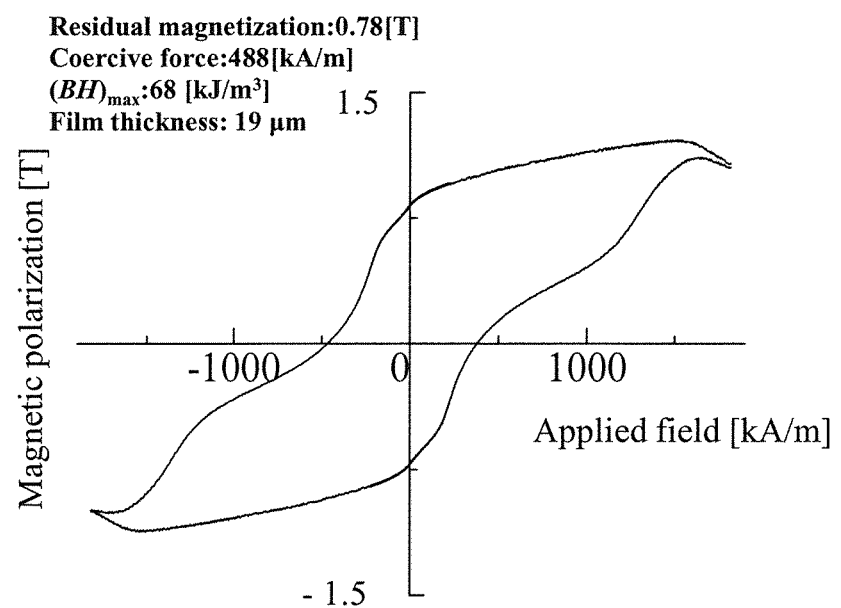

RARE EARTH THIN FILM MAGNET AND METHOD FOR PRODUCING SAME

BACKGROUND

Embodiments of the present invention relate to a rare earth thin film magnet produced from a Nd—Fe—B film formed on a silicon substrate and to a method of producing a rare earth thin film magnet of a Nd—Fe—B film formed via the pulsed laser deposition (PLD) method.

In recent years, pursuant to the weight-saving and miniaturization of electronic devices, the miniaturization and sophistication of rare earth magnets having superior magnetic properties are being advanced. Among the above, since a neodymium-iron-boron (Nd—Fe—B)-based magnet exhibits the highest maximum energy product among existing magnets, its practical application is expected to energy sectors such as MEMS (Micro Electro Mechanical Systems) and energy harvest, as well as the field of medical device.

It is known that this kind of rare earth magnet thin film is generally produced via the sputtering method (Patent Document 1 and Non-Patent Document 1), the pulsed laser deposition (PLD) method (Patent Document 2 and Non-Patent Document 2), or other physical vapor deposition (PVD) methods (Non-Patent Document 3). All of these documents form a rare earth magnet thin film on a metal substrate made from tantalum, molybdenum or other metals.

Meanwhile, when preparing micro actuators of micro magnetic devices for MEMS (Micro Electro Mechanical Systems), there are strong demands for stably forming a Nd—Fe—B film (rare earth magnet thin film) on a versatile Si substrate in order to effectively utilize the lithographic technique based on a silicon (Si) semiconductor.

Non-Patent Document 4 describes that, when a magnetic film having a composition that is equivalent to $Nd_2Fe_{14}B$, which is a stoichiometric composition, is directly deposited on a Si substrate, stress is generated due to the linear expansion difference between the Si substrate and the Nd—Fe—B film during the heat treatment process of deposition, and the magnetic film may be separated. Non-Patent Document 4 further describes that it is possible to form a Nd—Fe—B film that is free from separation, even with a thickness of 2 μm, by forming a $MoSi_2$ strain buffer film having a thickness of 50 nm on the Si substrate as a technique for alleviating the stress in the heat treatment.

Nevertheless, when the film thickness is thin at only several μm, the magnetic field that is generated from the plane of the film in the vertical direction decreases because it is easily affected by the diamagnetic field, and, while the magnetic field generated in the cross section direction of the film is not affected by the diamagnetic field, it becomes difficult to supply a magnetic field to a sufficient area because the volume of the thin film magnet is small. In order to generate a sufficient magnetic field outside the film, a film thickness of at least 10 μm or more is required. Meanwhile, when there is a difference in the linear expansion coefficient between the substrate and the film, because stress applied on the interface of the film and the substrate will increase as the film thickness increases, film separation becomes more likely. Thus for many years, there has been a demand for a stress buffer film material which is free from film separation even when a thick Nd—Fe—B film is deposited on the Si substrate.

Non-Patent Document 5 describes that it was possible to deposit a Nd—Fe—B film without any separation up to a film thickness of 20 μm by interposing a Ta film, which has an intermediate value of the linear expansion coefficient between Si and $Nd_2Fe_{14}B$, on a Si substrate by using the pulsed laser deposition (PLD) method. Nevertheless, when forming a film having a film thickness exceeding 20 μm, there were problems in that film separation would occur between the Nd—Fe—B film and the Ta film, and breakage would occur within the Si substrate.

CITATION LIST

Patent Documents

Patent Document 1: JP 2012-207274 A
Patent Document 2: JP 2009-091613 A
Patent Document 3: Japanese Patent Application No. 2014-218378
Patent Document 4: Japanese Patent Application No. 2016-043193

Non-Patent Documents

Non-Patent Document 1: N. M. Dempsey, A. Walther, F. May, D. Givord, K. Khlopkov, O. Gutfeisch: Appl. Phys. Lett. vol. 90 (2007) 092509-1-092509-3.
Non-Patent Document 2: H. Fukunaga, T. Kamikawatoko, M. Nakano, T. Yanai, F. Yamashita: J. Appl. Phys. vol. 109 (2011) 07A758-1-07A758-3.
Non-Patent Document 3: G. Rieger, J. Wecker, W. Rodewalt, W. Scatter, Fe.-W. Bach, T. Duda and W. Unterberg: J. Appl. Phys. vol. 87 (2000) 5329-5331.
Non-Patent Document 4: Adachi, Isa, Ita, Okuda: Annual Report of Ceramics Research Laboratory Vol. 6 (2006) 46-50.
Non-Patent Document 5: Oryoji, Nakano, Yanai, Fukunaga, Fujii: The Institute of Electrical Engineers of Japan, Magnetics Society Materials, MAG-13-075 (2013).

SUMMARY

The present inventors previously conducted research on methods for inhibiting the separation of the Nd—Fe—B film and the Si substrate and the breakage that occurs within the Si substrate. Consequently, the present inventors focused on the point that the linear expansion coefficient of Nd lies midway between the linear expansion coefficient of $Nd_2Fe_{14}B$ and the linear expansion coefficient of Si, and, by directly depositing a Nd—Fe—B film, in which the Nd content is higher than that of a stoichiometric composition, on a silicon substrate, discovered that the "Nd-rich phase existing at the interface of the Si substrate and the Nd—Fe—B film" is able to reduce the difference between the respective linear expansion coefficients and prevent film separation and substrate breakage (Patent Document 3).

According to this method, by depositing via the pulsed laser deposition method a Nd—Fe—B film having a composition in which the Nd content is higher than that of a stoichiometric composition; that is, a Nd—Fe—B film which satisfies 0.150≤Nd/(Nd+Fe), on a silicon substrate with a thermal oxide film formed thereon, it is possible to inhibit film separation and substrate breakage, and increase the thickness of the film up to around 160 μm. Nevertheless, while the coercive force increases as the Nd content increases on the one hand, there was a problem in that the residual magnetization and $(BH)_{max}$ would decrease on the other hand.

Furthermore, the present inventors also discovered that, by forming a Nd base film on a Si substrate, it is possible to stably deposit, without any film separation or substrate breakage, a Nd—Fe—B film which satisfies $0.120 \leq Nd/(Nd+Fe)<0.150$, which corresponds to a compositional range approximate to that of a stoichiometric composition $(Nd/(Nd+Fe)=0.125)$, and that the obtained thin film exhibits favorable magnetic properties (Patent Document 4). Nevertheless, with this method, it is necessary to mount two types of targets; specifically, a Nd target and a Nd—Fe—B target, in a pulsed laser deposition device, and there were problems in terms of production such as the device becoming complex, and the process becoming complicated because it is necessary to perform deposition upon switching the two types of target materials during the deposition process.

In order to resolve the foregoing problems, as a result of intense study, the present inventors discovered that favorable magnetic properties can be exhibited without any occurrence of film separation and substrate breakage even after heat treatment by forming a Nd—Fe—B base film has a composition in which a Nd content is higher than that of a stoichiometric composition on a Si substrate with an oxide film formed on a surface thereof, and additionally forming a film (nano composite film) which exhibits superior magnetic properties and has a texture in which an α-Fe phase and $Nd_2Fe_{14}B$ are alternately arranged and three-dimensionally dispersed on the base film. The present inventors additionally discovered that the foregoing structure can be continuously prepared from one type of target by adjusting the laser conditions upon performing PLD.

Based on the findings, the present inventors provide the following solutions:
1) A rare earth thin film magnet having Nd, Fe and B as essential components includes: a Nd—Fe—B base film is formed on a Si substrate having an oxide film formed on a surface thereof and has a composition in which a Nd content is higher than that of a stoichiometric composition, and a film (nano composite film) is formed on the base film and has a texture in which an α-Fe phase and $Nd_2Fe_{14}B$ are alternately arranged and three-dimensionally dispersed.
2) The rare earth thin film magnet according to 1) above, wherein a film thickness of the base film is 0.5 μm or more.
3) The rare earth thin film magnet according to 1) or 2) above, wherein a film thickness of the nano composite film is 10 μm or more and 42 μm or less.
4) The rare earth thin film magnet according to any one of 1) to 3) above, wherein a film thickness ratio of the base film relative to the nano composite film is 1/10 or less.
5) The rare earth thin film magnet according to any one of 1) to 4) above, wherein the oxide film on the surface of the Si substrate is a thermal oxide film.
6) The rare earth thin film magnet according to any one of 1) to 5) above, wherein the rare earth thin film magnet has a residual magnetization of 0.70 T or more.
7) The rare earth thin film magnet according to any one of 1) to 6) above, wherein the rare earth thin film magnet has a coercive force of 480 kA/m or more.
8) The rare earth thin film magnet according to any one of 1) to 7) above, wherein the rare earth thin film magnet has a maximum energy product $(BH)_{max}$ of 70 kJ/m³ or more.
9) A method of producing a rare earth thin film magnet, the method includes: forming an oxide film on a Si substrate; forming a Nd—Fe—B base film having a composition in which a Nd content is higher than that of a stoichiometric composition on the Si substrate, as a first layer via pulsed laser deposition; forming a film having a texture in which an α-Fe phase and $Nd_2Fe_{14}B$ are alternately arranged and three-dimensionally dispersed on the first layer, as a second layer via pulsed laser deposition; and thereafter performing heat treatment.
10) The method of producing a rare earth thin film magnet according to 9) above, wherein deposition is performed using a target made from $Nd_xFe_{14}B$ (where X is a number that satisfies 2.1 to 2.7).
11) The method of producing a rare earth thin film magnet according to 10) above, wherein a laser intensity density satisfies 1 J/cm² or more and less than 10 J/cm² in forming the base film as the first layer and satisfies 10 J/cm² or more and 1000 J/cm² or less in forming the film having a texture in which an α-Fe phase and $Nd_2Fe_{14}B$ are alternately arranged as the second layer.
12) The method of producing a rare earth thin film magnet according to any one of 9) to 11) above, wherein the heat treatment is performed at 500° C. or higher and 800° C. or less.

The embodiment of the present invention can produce a rare earth thin film magnet which exhibits favorable magnetic properties and is less susceptible to the occurrence of film separation and substrate breakage by forming a Nd—Fe—B base film which is formed on a Si substrate with an oxide film formed on a surface thereof and has a composition in which a Nd content is greater than that of a stoichiometric composition, depositing an α-Fe/Nd—Fe—B nano composite film on the base film, and thereafter performs heat treatment thereto. Furthermore, the embodiment of the present invention enables to continuously and stably form Nd—Fe—B films having the foregoing structure by using only one type of Nd—Fe—B target and changing the intensity of the laser with which the target is irradiated.

BRIEF DESCRIPTION OF THE DRAWINGS

FIG. 1 This is a schematic cross section showing an example of the Nd—Fe—B rare earth thin film magnet of the embodiment of the present invention.
FIG. 2 This is a diagram showing the post-deposition X-ray diffraction pattern of Example 1.
FIG. 3 This is a diagram showing a TEM observation photograph of the rare earth thin film magnet of Example 1.
FIG. 4 This is a diagram showing the magnetic properties of the rare earth thin film magnet of Example 1.
FIG. 5 This is a photograph showing the appearance of the diced thin film magnet of Example 1.
FIG. 6 This is a diagram showing the magnetic properties of the rare earth thin film magnet of Comparative Example 4.

DETAILED DESCRIPTION

The embodiment of the present invention is a rare earth thin film magnet having Nd, Fe and B as essential components, wherein a Nd—Fe—B base film is formed on a Si substrate having an oxide film formed on a surface thereof and has a composition in which a Nd content is higher than that of a stoichiometric composition, and a film (nano composite film) is formed on the base film and has a texture in which an α-Fe phase and $Nd_2Fe_{14}B$ are alternately arranged and three-dimensionally dispersed. The schematic cross section of the rare earth thin film magnet of the embodiment of the present invention is shown in FIG. 1.

A nano composite film has a structure in which an α-Fe phase (soft phase: having high saturation magnetization) and a $Nd_2Fe_{14}B$ phase of a stoichiometric composition (hard phase: having high coercive force) are alternately arranged and three-dimensionally dispersed, and exhibits superior magnetic properties. Moreover, each crystal grain size is roughly 10 nm to 30 nm.

The film thickness of a nano composite film is preferably 10 μm or more and 42 μm or less. When the film thickness is less than 10 μm, it is not possible to extract a sufficient magnetic field outside the film. Meanwhile, when the film thickness exceeds 42 μm, the ratio of thickness of the nano composite film relative to the thickness of the base film will increase, and there are cases where separation and other problems cannot be sufficiently suppressed due to the relationship of mechanical strength.

A Nd—Fe—B base film has a composition in which a Nd content is higher than that of a stoichiometric composition; specifically, the atomic ratio of Nd and Fe satisfies the condition of 0.150≤Nd/(Nd+Fe). A base film containing a higher amount of Nd than a stoichiometric composition alleviates a difference of linear expansion coefficients between the Si substrate and the nano composite film, and contributes to suppressing film separation and substrate breakage. Furthermore, the crystal grain size of the Nd—Fe—B base film is roughly 200 nm to 300 nm, and this is clearly differentiated from a Nd—Fe—B phase in the foregoing nano composite film.

The Nd—Fe—B base film preferably has a film thickness of 0.5 μm or more. When the film thickness is less than 0.5 μm, it becomes difficult to uniformly cover the entire substrate surface, and the effect of suppressing separation and other problems may deteriorate. Meanwhile, the film thickness of the Nd—Fe—B base film is preferably less than a film thickness ratio of 1/10 relative to the film thickness of the nano composite film. When the film thickness is any thicker, a notable two-jump configuration may arise in the M-H characteristics, and the magnetic properties may deteriorate.

The expression "two-jump configuration" as used in the embodiment of the present invention refers to a phenomenon where a plurality of inflection points can be confirmed in a hysteresis loop of the M-H characteristics and, as shown in Comparative Example 4 described later, in the second quadrant of the hysteresis loop (excluding those on the X axis and the Y axis), in a case where a point indicating the residual magnetization on a magnetic polarization axis (Y axis) and a point indicating the coercive force on an external magnetic field axis (X axis) are connected with a straight line, refers to a phenomenon where such straight line and the M-H loop may intersect within the second quadrant.

Furthermore, from the perspective of adhesion with the base film, the oxide film formed on the Si substrate is preferably a thermal oxide film. When a natural oxide film is used, there are cases where film separation occurs at the interface of Si and the rare earth thin film magnet. Meanwhile, when a thermal oxide film is used, based on the test result that the Si substrate itself will break, it is considered that the base layer adheres more favorably to a thermal oxide film in comparison to a natural oxide film.

Moreover, a thermal oxide film is preferable in that its film thickness can be controlled more easily in comparison to a natural oxide film. Note that the thickness of a thermal oxide film is 380 to 600 nm, preferably 500 to 550 nm. This is differentiated from the thickness of a natural oxide film on a general Si substrate which is several nm (for instance, roughly 1 to 3 nm).

The rare earth thin film magnet of the embodiment of the present invention exhibits superior magnetic properties, but in particular is able to achieve residual magnetization of 0.70 T or more, coercive force of 480 kA/m or more, and maximum energy product $(BH)_{max}$ of 70 kJ/m$^3$ or more. The embodiment of the present invention is particularly superior with respect to the point that it can maintain the foregoing favorable magnetic properties without any film separation or the like even when a thick film is produced.

As the method of producing the rare earth thin film magnet, foremost, a Si substrate with an oxide film formed thereon is placed in a pulsed laser deposition (PLD) device, and then a Nd—Fe—B target is mounted so as to face the substrate. Next, the chamber is evacuated so that the degree of vacuum becomes $2\times10^{-5}$ to $8\times10^{-5}$ Pa, the target is subsequently irradiated with a laser through a condenser lens, and deposition is thereby started. As the laser, a Nd:YAG laser (oscillation wavelength: 355 nm, repetition frequency: 30 Hz) may be used.

The target to be used shall be $Nd_xFe_{14}B$ (X: 2.1 to 2.7) having a composition in which the Nd content is higher than that of a stoichiometric composition. When X is less than 2.1, the Nd concentration in the Nd—Fe—B base film decreases and the Nd-rich layer formed at the interface of the Si substrate and the base film becomes thin, and film separation or breakage within the Si substrate may occur after the heat treatment. Meanwhile, when X exceeds 2.7, the volume ratio of the α-Fe phase in the nano composite film will decrease, and Nd as an overabundant nonmagnetic component may remain and cause the residual magnetization to deteriorate.

Subsequently, in a state where the focal distance is removed from the surface of the target (defocused irradiation), laser is irradiated by setting the laser intensity to a low energy density (1 J/cm$^2$ or more and less than 10 J/cm$^2$) to form a Nd—Fe—B base film having a composition containing a higher amount of Nd than a stoichiometric composition. When the laser intensity density is less than 1 J/cm$^2$, numerous droplets are generated when the target is irradiated with a laser which causes the density to deteriorate, and this may consequently deteriorate the magnetic properties. Meanwhile, when the laser intensity density is 10 J/cm$^2$ or more, it is not possible to obtain a Nd—Fe—B film with the intended compositional ratio in which the atomic ratio of Nd and Fe satisfies the condition of 0.150≤Nd/(Nd+Fe) and the Nd composition is higher than the stoichiometric composition. With this Nd-overabundant Nd—Fe—B base layer, a Nd-overabundant layer is formed directly on the Si substrate during the subsequent heat treatment process, and the effect of alleviating stress is exhibited.

Next, the same Nd—Fe—B target is used and, by irradiating a laser by aiming the focal distance of the laser on the target material surface (by switching to a focused irradiation), deposition is performed at a laser intensity (10 to 1000 J/cm$^2$) in which the energy density has been increased. When the laser intensity density is less than 10 J/cm$^2$, a nano composite film cannot be stably formed. Meanwhile, when the laser intensity density exceeds 1000 J/cm$^2$, a phenomenon where ablation is discontinued may occur. When deposition is performed under the foregoing focus conditions, even when a target material having a composition that is Nd-overabundant is used, it is possible to form a nano composite film from α-Fe and a Nd—Fe—B layer of a stoichiometric composition.

The target surface irradiated with a laser as described above will undergo chemical reaction and melting reaction, and a plasma referred to as a plume is generated. As a result of this plume reaching the opposing substrate, it is possible to form an amorphous film on the substrate. The amorphous film deposited in the manner described above is subject to pulsed heat treatment after deposition under the following conditions; namely, a rated output of approximately 8 kW, and a maximum output holding time of roughly 3 seconds, in order to crystallize the Nd—Fe—B amorphous phase.

Here, when heat treatment is not sufficiently performed, the crystallization of the Nd—Fe—B amorphous phase in the film will be insufficient and numerous amorphous phases may remain. Meanwhile, excessive heat treatment may coarsen the crystal grains, and deteriorate the magnetic properties. Accordingly, the pulsed heat treatment is preferably performed within a range of 500 to 800° C. Incidentally, pulsed heat treatment can promote the instant crystallization of the sample and realize the refinement of the crystal grains, by irradiating infrared rays for an extremely short time.

Subsequently, by performing pulsed magnetization to the crystallized thin film at, for example, a magnetic field of 7 T, it is possible to prepare a rare earth thin film magnet. Note that the there is no particular limitation regarding the magnetization method in the embodiment of the present invention, and publicly known magnetization methods may be used. It is thereby possible to produce a Nd—Fe—B rare earth thin film magnet. This rare earth thin film magnet not only exhibits superior magnetic properties, but also is effective for preparing micro actuators of micro magnetic devices for MEMS because it is directly deposited on a versatile Si substrate.

EXAMPLES

The embodiment of the present invention is now explained with reference to the Examples and Comparative Examples. Note that these Examples are merely illustrative, and the embodiment of the present invention shall in no way be limited thereby. In other words, various modifications and other embodiments are covered by the embodiment of the present invention, and the embodiment of the present invention is limited only by the scope of its claims.

Example 1

A $Nd_{2.5}Fe_{14}B$ target was prepared, and a monocrystal Si (100) having a thickness of 622 µm and 5 mm square was used as a substrate. Note that a thermal oxide film having a thickness of approximately 515 nm, which was formed by being heated in an oxygen atmosphere at a temperature of 800° C., has been formed on the Si substrate. Subsequently, the foregoing target and substrate were mounted at their predetermined positions in a pulsed laser deposition device, the inside of a chamber was thereafter evacuated to achieve a vacuum, and, after confirming that the degree of vacuum has reached $10^{-5}$ Pa, the target being rotated at approximately 11 rpm was irradiated with a Nd:YAG laser (oscillation wavelength: 355 nm) having a repetition frequency of 30 Hz, and the target substance was ablated and a film was deposited on the substrate. Here, the distance between the target and the substrate was set to 10 mm.

Foremost, a Nd—Fe—B amorphous base film was deposited in a film thickness of 1.0 µm on the Si substrate by setting the laser intensity density on the target surface to roughly 2 J/cm², the laser intensity density was thereafter increased to roughly 20 J/cm², and an $\alpha$-Fe/$Nd_2Fe_{14}B$ nano composite amorphous film was continuously deposited in a film thickness of 23 µm on the base film. Note that, as the method of controlling the energy density, a method of moving the condenser lens of the laser and shifting the focal distance, and thereby changing the laser spot area was used.

Here, the DF (defocus) Rate which quantifies the shift from the focal distance, is calculated from the formula of DF Rate=(TD−FD)/FD (TD: distance between the target and the condenser lens; FD: focal distance). Furthermore, upon depositing the Nd—Fe—B base film, the DF Rate was set to 0.3, and, upon depositing the nano composite film, the DF Rate was set to 0 (zero).

The post-deposition X-ray diffraction pattern is shown in FIG. 2. In FIG. 2, in addition to the peak of the $\alpha$-Fe crystal grains being confirmed, similar results as the X-ray diffraction pattern of a nano composite film formed on a conventional Ta substrate are obtained. Next, pulsed heat treatment was performed at a rated output of 8 kW and a maximum output holding time of approximately 3 seconds to crystallize the Nd—Fe—B-based amorphous phase. FIG. 3 shows the transmission electron microscope (TEM) cross section photograph of the film after heat treatment. In the TEM photograph of FIG. 3, similar results as the nano composite film formed on a conventional Ta substrate are obtained. Subsequently, pulsed magnetization was performed at a magnetic field of 7 T to prepare a rare earth thin film magnet. In order to check the separation characteristics of the film, a 5 mm×5 mm sample was subject to cutting work via dicing in order to split the sample into quarters each having a size of 2.5 mm×2.5 mm. Consequently, as shown in FIG. 5, it was confirmed that the samples could be processed without any mechanical damage. Next, the magnetic properties of the diced samples were measured using a VSM (Vibrating Sample Magnetometer). As shown in Table 1, the results were as follows; specifically, residual magnetization was 0.87 T, coercive force was 570 kA/m, and $(BH)_{max}$ was 86 kJ/m³, and favorable magnetic properties were obtained. FIG. 4 shows the M-H loop.

Examples 2 to 11

In Examples 2 to 11, the same method as Example 1 was used to deposit a Nd—Fe—B base film on a Si substrate and then deposit an $\alpha$-Fe/$Nd_2Fe_{14}B$ nano composite film thereon, and thereafter perform pulsed heat treatment to obtain a crystallized film. Here, in each of Examples 2 to 11, the target composition, film thickness of the Nd base film, film thickness of the nano composite film, and laser intensity density were changed as shown in Table 1. Each of the thin films was subject to pulsed magnetization to prepare a rare earth thin film magnet, and the film separation and magnetic properties of the obtained rare earth thin film magnet were checked in the same manner as Example 1. Consequently, as shown in Table 1, all Examples 2 to 6 is free from any occurrence of film separation and substrate breakage and exhibits favorable magnetic properties.

Comparative Example 1

The same method as Example 1 was used to deposit a Nd—Fe—B base film on a Si substrate and then deposit an $\alpha$-Fe/$Nd_2Fe_{14}B$ nano composite film thereon, and thereafter perform pulsed heat treatment to obtain a crystallized film. However, the target composition was set to be $Nd_2Fe_{14}B$. This thin film was subject to pulsed magnetization to prepare a rare earth thin film magnet. The thus obtained rare earth thin film magnet was subject to cutting work via dicing in order to split the 5 mm×5 mm sample into quarters each having a size of 2.5 mm×2.5 mm based on the same method as Example 1, but film separation occurred and it was not possible to check the magnetic properties. The cause is considered to be that the amount of Nd in the Nd—Fe—B base film was so small that it was not possible to faun a Nd-rich layer which could play the role of alleviating the strain at the interface of the Si substrate.

Comparative Example 2

The same method as Example 1 was used to deposit a Nd—Fe—B base film on a Si substrate and then deposit an α-Fe/Nd$_2$Fe$_{14}$B nano composite film thereon, and thereafter perform pulsed heat treatment to obtain a crystallized film. However, the film thickness of the base film was set to be 0.45 μm. This thin film was subject to pulsed magnetization to prepare a rare earth thin film magnet. The thus obtained rare earth thin film magnet was subject to cutting work via dicing in order to split the 5 mm×5 mm sample into quarters each having a size of 2.5 mm×2.5 mm based on the same method as Example 1, but film separation occurred and it was not possible to measure the magnetic properties. The cause is considered that because the Nd—Fe—B base film was thin, it was not possible to uniformly cover the entire surface of the Si substrate surface.

Comparative Example 3

The same method as Example 1 was used to deposit a Nd—Fe—B base film on a Si substrate and then deposit an α-Fe/Nd$_2$Fe$_{14}$B nano composite film thereon, and thereafter perform pulsed heat treatment to obtain a crystallized film. However, the film thickness of the nano composite film was set to be 43 μm. This thin film was subject to pulsed magnetization to prepare a rare earth thin film magnet. The thus obtained rare earth thin film magnet was subject to cutting work via dicing in order to split the 5 mm×5 mm sample into quarters each having a size of 2.5 mm×2.5 mm based on the same method as Example 1, but film separation partially occurred and it was not possible to measure the magnetic properties. Incidentally, while the film thickness ratio of the base film relative to the nano composite film was 0.07 in Comparative Example 3 and fell within the range of the technical feature (0.1 or less) capable of inhibiting the magnetic properties of the base film from influencing the nano composite film, because the nano composite film was too thick, the mechanical strength deteriorated and it was not possible to inhibit film separation and substrate breakage, and the magnetic properties could not be measured.

Comparative Example 4

The same method as Example 1 was used to deposit a Nd—Fe—B base film on a Si substrate and then deposit an α-Fe/Nd$_2$Fe$_{14}$B nano composite film thereon, and thereafter perform pulsed heat treatment to obtain a crystallized film. However, the film thickness ratio of the base film relative to the nano composite film was set to be 0.11. Next, this thin film was subject to pulsed magnetization to prepare a rare earth thin film magnet. The thus obtained rare earth thin film magnet was subject to cutting work via dicing in order to split the 5 mm×5 mm sample into quarters each having a size of 2.5 mm×2.5 mm based on the same method as Example 1. Incidentally, it was confirmed that the samples could be processed without any mechanical damage. Next, the magnetic properties of the diced samples were measured using a VSM (Vibrating Sample Magnetometer). Residual magnetization was 0.78 T, coercive force was 488 kA/m, and (BH)$_{max}$ was 68 kJ/m$^3$, but as shown in FIG. 6, an extreme two-jump configuration was observed in the M-H characteristics. Here, the expression "two-jump configuration of the M-H characteristics" refers to a phenomenon where a plurality of inflection points of an M-H loop can be confirmed as though magnetic materials having different magnetic properties coexist. In the present invention, the cause of such two-jump configuration is considered to be as follows; specifically, as a result of the film thickness of the base film increasing relative to the film thickness of the nano composite film, the influence of the magnetic properties of the base film has increased, and the respective magnetization processes of the base film and the nano composite film have been reflected.

TABLE 1

| | Target composition Nd x Fe14B | Laser energy density (J/cm2) Base film | Laser energy density (J/cm2) Nano composite film | NdFeB base Film thickness (μm) (1) | Nano composite film Film thickness (μm) (2) | Film thickness ratio (1)/(2) | Residual magnetization (T) | Coercive force (kA/m) | (BH)max (kJ/m3) | Two-jump configuration of loop | Film adhesion |
|---|---|---|---|---|---|---|---|---|---|---|---|
| Example 1 | X = 2.5 | 2 | 20 | 1.0 | 23 | 0.04 | 0.87 | 570 | 86 | None | No film separation, No substrate breakage |
| Example 2 | X = 2.5 | 2 | 20 | 0.50 | 21 | 0.02 | 0.90 | 540 | 87 | None | No film separation, No substrate breakage |
| Example 3 | X = 2.5 | 2 | 20 | 2.0 | 42 | 0.05 | 0.85 | 530 | 86 | None | No film separation, No substrate breakage |
| Example 4 | X = 2.5 | 2 | 20 | 1.8 | 18 | 0.10 | 0.82 | 550 | 84 | None | No film separation, No substrate breakage |
| Example 5 | X = 2.1 | 2 | 20 | 1.0 | 20 | 0.05 | 0.95 | 480 | 89 | None | No film separation, No substrate breakage |
| Example 6 | X = 2.7 | 2 | 20 | 1.5 | 20 | 0.08 | 0.70 | 650 | 70 | None | No film separation, No substrate breakage |
| Example 7 | X = 2.5 | 2 | 20 | 1.1 | 19 | 0.06 | 0.86 | 565 | 84 | None | No film separation, No substrate breakage |

TABLE 1-continued

| | Target composition Nd x Fe14B | Laser energy density (J/cm2) Base film | Laser energy density (J/cm2) Nano composite film | NdFeB base Film thickness (μm) (1) | Nano composite film Film thickness (μm) (2) | Film thickness ratio (1)/(2) | Residual magnetization (T) | Coercive force (kA/m) | (BH)max (kJ/m3) | Two-jump configuration of loop | Film adhesion |
|---|---|---|---|---|---|---|---|---|---|---|---|
| Example 8 | X = 2.5 | 5 | 70 | 1.5 | 23 | 0.07 | 0.89 | 542 | 85 | None | No film separation, No substrate breakage |
| Example 9 | X = 2.5 | 7 | 100 | 1.3 | 17 | 0.08 | 0.92 | 539 | 82 | None | No film separation, No substrate breakage |
| Example 10 | X = 2.5 | 8 | 300 | 0.9 | 18 | 0.05 | 0.91 | 545 | 83 | None | No film separation, No substrate breakage |
| Example 11 | X = 2.5 | 9 | 800 | 1.4 | 21 | 0.07 | 0.93 | 542 | 81 | None | No film separation, No substrate breakage |
| Comparative Example 1 | X = 2.0 | 2 | 20 | 2.0 | 30 | 0.07 | | | | None | Film separation, Substrate breakage |
| Comparative Example 2 | X = 2.5 | 2 | 20 | 0.45 | 22 | 0.02 | | | | None | Film separation, Substrate breakage |
| Comparative Example 3 | X = 2.5 | 2 | 20 | 3.0 | 43 | 0.07 | | | | None | Film separation, Substrate breakage |
| Comparative Example 4 | X = 2.5 | 2 | 20 | 2.0 | 19 | 0.11 | 0.78 | 488 | 68 | Yes | No film separation, No substrate breakage |

The embodiment of the present invention enables to form a Nd—Fe—B base film on a Si substrate and thereafter continuously deposit α-Fe/Nd—Fe—B nano composite film by using only one type of target and simply changing the intensity of the laser with which the target is irradiated, which significantly improves the productivity of rare earth magnets. Furthermore, the obtained rare earth thin film magnet is free from any occurrence of film separation and substrate breakage and exhibits favorable magnetic properties. The Nd—Fe—B rare earth thin film magnet of the embodiment of the present invention is effective for use as a magnetic device to be applied in the energy sector such as energy harvest as well as in the field of medical appliances. Moreover, the embodiment of the present invention is particularly effective for use in preparing micro actuators of micro magnetic devices for MEMS.

The invention claimed is:

1. A rare earth thin film magnet having Nd, Fe and B as essential components comprising:
   a Nd—Fe—B base film on a Si substrate having an oxide film formed on a surface thereof;
   the Nd—Fe—B base film has a composition in which a Nd content is higher than that of a stoichiometric composition of $Nd_2$—$Fe_{14}$—B;
   nano composite film having a film thickness of 10 μm or more and 42 μm or less on the base film, and
   the nano composite film has a texture in which an α-Fe phase and $Nd_2Fe_{14}B$ are alternately arranged and three-dimensionally dispersed.

2. The rare earth thin film magnet according to claim 1, wherein a film thickness of the base film is 0.5 μm or more.

3. The rare earth thin film magnet according to claim 2, wherein a film thickness ratio of the base film relative to the nano composite film is 1/10 or less.

4. The rare earth thin film magnet according to claim 3, wherein the oxide film on the surface of the Si substrate is a thermal oxide film.

5. The rare earth thin film magnet according to claim 4, wherein the rare earth thin film magnet has a residual magnetization of 0.70 T or more.

6. The rare earth thin film magnet according to claim 5, wherein the rare earth thin film magnet has a coercive force of 480 kA/m or more.

7. The rare earth thin film magnet according to claim 6, wherein the rare earth thin film magnet has a maximum energy product $(BH)_{max}$ of 70 kJ/m³ or more.

8. The rare earth thin film magnet according to claim 1, wherein a film thickness ratio of the base film relative to the nano composite film is 1/10 or less.

9. The rare earth thin film magnet according to claim 1, wherein the oxide film on the surface of the Si substrate is a thermal oxide film.

10. The rare earth thin film magnet according to claim 1, wherein the rare earth thin film magnet has a residual magnetization of 0.70 T or more.

11. The rare earth thin film magnet according to claim 1, wherein the rare earth thin film magnet has a coercive force of 480 kA/m or more.

12. The rare earth thin film magnet according to claim 1, wherein the rare earth thin film magnet has a maximum energy product $(BH)_{max}$ of 70 kJ/m³ or more.

13. A method of producing a rare earth thin film magnet, the method comprising:
   forming an oxide film on a Si substrate;
   forming a Nd—Fe—B base film having a composition in which a Nd content is higher than that of a stoichiometric composition of $Nd_2$—$Fe_{14}$—B on the Si substrate, as a first layer via pulsed laser deposition;
   forming a nano composite film having a film thickness of 10 μm or more and 42 μm or less and having a texture in which an α-Fe phase and $Nd_2Fe_{14}B$ are alternately arranged and three-dimensionally dispersed on the first layer, as a second layer via pulsed laser deposition; and
   thereafter performing heat treatment thereto.

14. The method of producing a rare earth thin film magnet according to claim 13, wherein deposition is performed using a target made from $Nd_XFe_{14}B$ (where X is a number that satisfies 2.1 to 2.7).

15. The method of producing a rare earth thin film magnet according to claim 14, wherein a laser intensity density satisfies 1 $J/cm^2$ or more and less than 10 $J/cm^2$ in forming the base film as the first layer and satisfies 10 $J/cm^2$ or more and 1000 $J/cm^2$ or less in forming the nano composite film having a texture in which an $\alpha$-Fe phase and $Nd_2Fe_{14}B$ are alternately arranged as the second layer.

16. The method of producing a rare earth thin film magnet according to claim 15, wherein the heat treatment is performed at 500° C. or higher and 800° C. or less.

17. The method of producing a rare earth thin film magnet according to claim 13, wherein the heat treatment is performed at 500° C. or higher and 800° C. or less.

* * * * *